(12) United States Patent
Kotani et al.

(10) Patent No.: US 10,340,662 B2
(45) Date of Patent: Jul. 2, 2019

(54) QUANTUM CASCADE LASER

(71) Applicants: Sharp Kabushiki Kaisha, Sakai, Osaka (JP); The University of Tokyo, Bunkyo-ku, Tokyo (JP)

(72) Inventors: Teruhisa Kotani, Sakai (JP); Yasuhiko Arakawa, Bunkyo-ku (JP)

(73) Assignees: Sharp Kabushiki Kaisha, Sakai (JP); The University of Tokyo, Tokyo (JP)

( * ) Notice: Subject to any disclaimer, the term of this patent is extended or adjusted under 35 U.S.C. 154(b) by 0 days.

(21) Appl. No.: 15/314,630

(22) PCT Filed: May 7, 2015

(86) PCT No.: PCT/JP2015/063183
§ 371 (c)(1),
(2) Date: Nov. 29, 2016

(87) PCT Pub. No.: WO2015/186462
PCT Pub. Date: Dec. 10, 2015

(65) Prior Publication Data
US 2017/0201071 A1 Jul. 13, 2017

(30) Foreign Application Priority Data
Jun. 4, 2014 (JP) .................. 2014-115751

(51) Int. Cl.
*H01S 3/00* (2006.01)
*H01S 5/34* (2006.01)
(Continued)

(52) U.S. Cl.
CPC .......... *H01S 5/3401* (2013.01); *H01S 5/0425* (2013.01); *H01S 5/3402* (2013.01);
(Continued)

(58) Field of Classification Search
CPC .... H01S 5/3401; H01S 5/3407; H01S 5/0425; H01S 5/34333; H01S 5/2231;
(Continued)

(56) References Cited

U.S. PATENT DOCUMENTS 6,995,389 B2 * 2/2006 Kim ................. B82Y 20/00
257/13
8,068,528 B2 * 11/2011 Edamura ........... B82Y 20/00
372/43.01

(Continued)

FOREIGN PATENT DOCUMENTS

JP 2001-148545 A 5/2001
JP 201148546 * 5/2001 ........... H01L 33/06
(Continued)

OTHER PUBLICATIONS

Mikhail A. Belkin et al. "Terahertz quantum-cascade-laser source based on intracavity difference-frequency generation" Published online: May 1, 2007; nature photonics| vol. 1| May 2007| pp. 288-292.*

(Continued)

*Primary Examiner* — Jessica S Manno
*Assistant Examiner* — Delma R Fordé
(74) *Attorney, Agent, or Firm* — Keating & Bennett, LLP (57) ABSTRACT

A QCL (10) includes a first electrode (15), a first contact layer (11) that is in contact with the first electrode (15) and is made of a first compound semiconductor, a second electrode (14) having a polarity opposite to that of the first electrode (15), a second contact layer (13) that is in contact with the second electrode (14) and is made of a second compound semiconductor, and an active layer (12) disposed between the first contact layer (11) and the second contact layer (13) and including two or more active layer units. Each of the active layer units includes one or more quantum well (Continued)

layers made of a third compound semiconductor and one or more barrier layers made of a fourth compound semiconductor, and each of the quantum well layers and each of the barrier layers are alternately stacked. The vibrational energies of longitudinal optical phonons of the third compound semiconductor and the fourth compound semiconductor are higher than the vibrational energy of a longitudinal optical phonon of GaAs and lower than or equal to the vibrational energy of a longitudinal optical phonon of AlN.

8 Claims, 6 Drawing Sheets

(51) Int. Cl.
| | | |
|---|---|---|
| *H01S 5/343* | (2006.01) | |
| *H01S 5/042* | (2006.01) | |
| *H01S 5/22* | (2006.01) | |
| *H01S 5/32* | (2006.01) | |
| *H01S 5/022* | (2006.01) | |
| *H01S 5/20* | (2006.01) | |

(52) U.S. Cl.
CPC ........ *H01S 5/3407* (2013.01); *H01S 5/34333* (2013.01); *H01S 5/0224* (2013.01); *H01S 5/0421* (2013.01); *H01S 5/2031* (2013.01); *H01S 5/2077* (2013.01); *H01S 5/22* (2013.01); *H01S 5/3202* (2013.01)

(58) Field of Classification Search
CPC . H01S 5/2232; H01S 5/30; H01S 5/34; H01S 5/22; H01S 5/2228; H01S 5/309; H01S 5/3427; H01S 5/34346; H01S 5/0422; H01S 5/0206; H01S 5/0215; H01S 3/038; H01S 4/00
See application file for complete search history.

(56) References Cited

U.S. PATENT DOCUMENTS

| | | | | |
|---|---|---|---|---|
| 8,121,164 | B1* | 2/2012 | Lyakh | B82Y 20/00 372/44.01 |
| 8,817,835 | B2* | 8/2014 | Kato | H01S 5/3402 372/43.01 |
| 9,001,858 | B1* | 4/2015 | Hirayama | H01S 5/3425 372/45.012 |
| 9,025,632 | B2* | 5/2015 | Hirayama | B82Y 20/00 372/45.012 |
| 2006/0039431 | A1 | 2/2006 | Sekiguchi et al. | |
| 2006/0215718 | A1* | 9/2006 | Yasuda | B82Y 20/00 372/45.012 |
| 2007/0085093 | A1* | 4/2007 | Ohmae | C30B 23/04 257/89 |
| 2008/0219308 | A1* | 9/2008 | Yamanishi | B82Y 20/00 372/44.01 |
| 2011/0026556 | A1 | 2/2011 | Fujita et al. | |
| 2011/0216788 | A1* | 9/2011 | Oki | 372/18 |
| 2013/0322480 | A1* | 12/2013 | Edamura | H01S 5/3401 372/45.01 |
| 2016/0064901 | A1* | 3/2016 | Terashima | H01S 5/042 372/4 |
| 2016/0087408 | A1* | 3/2016 | Fujita | H01S 5/0604 372/45.012 |
| 2017/0201072 | A1* | 7/2017 | Kotani | H01S 5/3401 |
| 2017/0338627 | A1* | 11/2017 | Kotani | H01S 5/3421 |

FOREIGN PATENT DOCUMENTS

| | | | | |
|---|---|---|---|---|
| JP | 2006-032691 A | | 2/2006 | |
| JP | 2011-035139 A | | 2/2011 | |
| JP | 2013-171842 A | | 9/2013 | |
| JP | 02013171842 A | * | 9/2013 | ............ H01S 5/343 |
| WO | 2008/007522 A1 | | 1/2008 | |

OTHER PUBLICATIONS

Optical properties of Gallium Arsenide (GaAs), http://www.ioffe.ru/SVA/NSM/Semicond/GaAs/optic.html, pp. 1-3, Nov. 30, 2017.*
NSM Archive—Indium Nitride (InN)—Optical properties, http://www.ioffe.ru/SVA/NSM/Semicond/InN/optic.html, pp. 1-3, Nov. 30, 2017.*
NSM Archive—Gallium Nitride (GaN)—Optical properties, http://www.ioffe.ru/SVA/NSM/Semicond/GaN/optic.html, pp. 1-4, Nov. 30, 2017.*
NSM Archive—Aluminum Nitride (AlN)—Optical properties, http://www.ioffe.ru/SVA/NSM/Semicond/AlN/optic.html, pp. 1-2, Nov. 30, 2017.*
English Translation of JP2001-148545, Date of publication of application May 29, 2001, pp. 1-69.*
Feng Xu et al., "High-efficiency InGaN/AlInGaN multiple quantum wells with lattice-matched AlInGaN superlattice barrier", Chin. Phys. B vol. 26, No. 1 (2017); pp. 017803-1 through 017803-5.*
A. Pierret et al. "Growth, structural and optical properties of AlGaN nanowires in the whole composition range" IOP Nanotechnology vol. 24 (2013), pp. 1-10.*
Professor S.C. Wang "GaN/AlGaN Terahertz Quantum Cascade Laser", Oct. 7, 2005, pp. 1-12.*
S. C. Wang et al. "Fabrication and Characteristics of GaN/AlGaN Multilayer structure for Terahertz Quantum-Cascade Laser" Proc. of SPIE vol. 6373 (2006) pp. 637309-1 through 637309-5.*
Professor S.C. Wang "Development of GaN/AlGaN Terahertz Quantum Cascade Laser", Nov. 19, 2008, pp. 1-22.*
Ozlem Celik et al. "Determination of the LO phonon energy by using electronic and optical methods in AlGaN/GaN", Central European Journal of Physics, (2012) pp. 1-7.*
M. Holtz et al. "Composition dependence of the optical phonon energies in hexagonal $Al_xGa_{1-x}N$", Journal of applied Physics vol. 89, No. 12, (Jun. 15, 2001), pp. 7977-7982.*
S. Gupta et al. "Optical properties of high-quality InGaAs/InAlAs multiple wells" American Institute of Physics vol. 65, No. 5, Mar. 1991, pp. 3219-3225.*
Optical properties of Gallium Indium Arsenide (GaInAs), http://www.ioffe.ru/SVA/NSM/Semicond/GaInAs/optic.html, pp. 1-2, Dec. 6, 2017.*
Energy Gap value for InGaN and InN, pp. 1-5 (Year: 2018).*
Official Communication issued in International Patent Application No. PCT/JP2015/063183, dated Jul. 21, 2015.
Jovanovic et al., "Simulation and design of GaN/AlGaN far-infrared ($\lambda\sim34$ µm) quantum-cascade laser", Applied Physics Letters vol. 84, No. 16, Apr. 19, 2004, 4 pages.
Hirayama et al., "Recent progress toward realizing GaN-based THz quantum cascade laser", Proceedings of SPIE, vol. 8993, Dec. 18, 2003, 9 pages.
Bellotti et al., "Monte Carlo study of GaN versus GaAs terahertz quantum cascade structures", Applied Physics Letters, vol. 92, No. 10, Mar. 11, 2008, 3 pages.

* cited by examiner

POSITION IN ACTIVE LAYER IN THICKNESS DIRECTION [nm]

QUANTUM CASCADE LASER

TECHNICAL FIELD

The present invention relates to a quantum cascade laser.

BACKGROUND ART

Quantum cascade lasers (hereafter referred to as "QCLs") are promising light sources capable of generating electromagnetic waves from the infrared range to the terahertz range (300 GHz to 10 THz) with high power, and the research and development of such quantum cascade lasers has been accelerated in recent years. In particular, there are no promising light sources (small light sources formed of a compound semiconductor) capable of generating electromagnetic waves in the terahertz range, except for QCLs. Therefore, QCLs are the most promising light sources capable of generating electromagnetic waves in the terahertz range. In such QCLs, intersubband population inversion in the conduction band or intersubband population inversion in the valence band in a multiple quantum well (hereafter referred to as "MQW") structure formed of a compound semiconductor occurs, which causes lasing.

QCLs capable of generating electromagnetic waves in the terahertz range have been often produced using a GaAs-based material, an InP-based material, or a GaSb-based material. However, lasing at a temperature of 200 K or higher has not been reported with any of the materials.

The factor of inhibiting lasing at a temperature of 200 K or higher is thermally excited phonon scattering. The thermally excited phonon scattering refers to a phenomenon in which when electrons or holes (hereafter referred to as "carriers") at the upper lasing level obtain in-plane kinetic energy by heat and thus the difference in energy between the carriers and the lower lasing level is higher than or equal to the vibrational energy of longitudinal optical (hereafter referred to as "LO") phonons, the carriers are scattered by the LO phonons to cause nonradiative relaxation to the lower lasing level.

For example, in a QCL (including a GaAs layer as a quantum well layer) that generates electromagnetic waves with about 2 THz (about 9 meV), the energy difference between the upper lasing level and the lower lasing level is about 9 meV (energy corresponding to lasing wavelength). At low temperatures, carriers are often present at the bottom of the energy band of the upper lasing level. Therefore, the transition of carriers present at the upper lasing level to the lower lasing level by LO phonon scattering does not occur.

However, when the temperature increases, carriers are thermally excited and the distribution becomes similar to, for example, a quasi-Fermi distribution. When the difference in energy between carriers thermally excited to the level higher than the bottom of the energy band of the upper lasing level and the lower lasing level is concordant with the vibrational energy of LO phonons of a compound semiconductor constituting the quantum well layer of the QCL, the thermally excited carriers are subjected to transition to the lower lasing level by LO phonon scattering. This transition occurs with higher probability than the stimulated emission from the upper lasing level to the lower lasing level. That is, the thermally excited carriers lose energy by not generation of electromagnetic waves but by LO phonon scattering. In addition, if the thermally excited carriers are subjected to transition to the lower lasing level by LO phonon scattering, the carriers that have lost energy occupy the lower lasing level, which suppresses the occurrence of population inversion. As a result, lasing is suppressed.

For example, in the above-described QCL, when carriers present at the upper lasing level obtain an energy of about 27 meV by heat, LO phonon scattering (nonradiative transition) becomes dominant, which suppresses lasing. Herein, the vibrational energy of LO phonons is a physical property intrinsic to materials. Therefore, if a GaAs layer is used as a quantum well layer in a QCL capable of generating electromagnetic waves in the terahertz range, it is difficult to operate the QCL at room temperature.

It is proposed in PTL 1 that a layer made of a compound semiconductor different from GaAs is used as a quantum well layer in a QCL capable of generating electromagnetic waves in the terahertz range. PTL 1 discloses that a GaN layer is used as a quantum well layer, and the vibrational energy of LO phonons of GaN is about 90 meV. Therefore, the occurrence of the above-described thermally excited phonon scattering is believed to be prevented.

CITATION LIST

Patent Literature

PTL 1: Japanese Unexamined Patent Application Publication No. 2013-171842

SUMMARY OF INVENTION

Technical Problem

Figure 11:
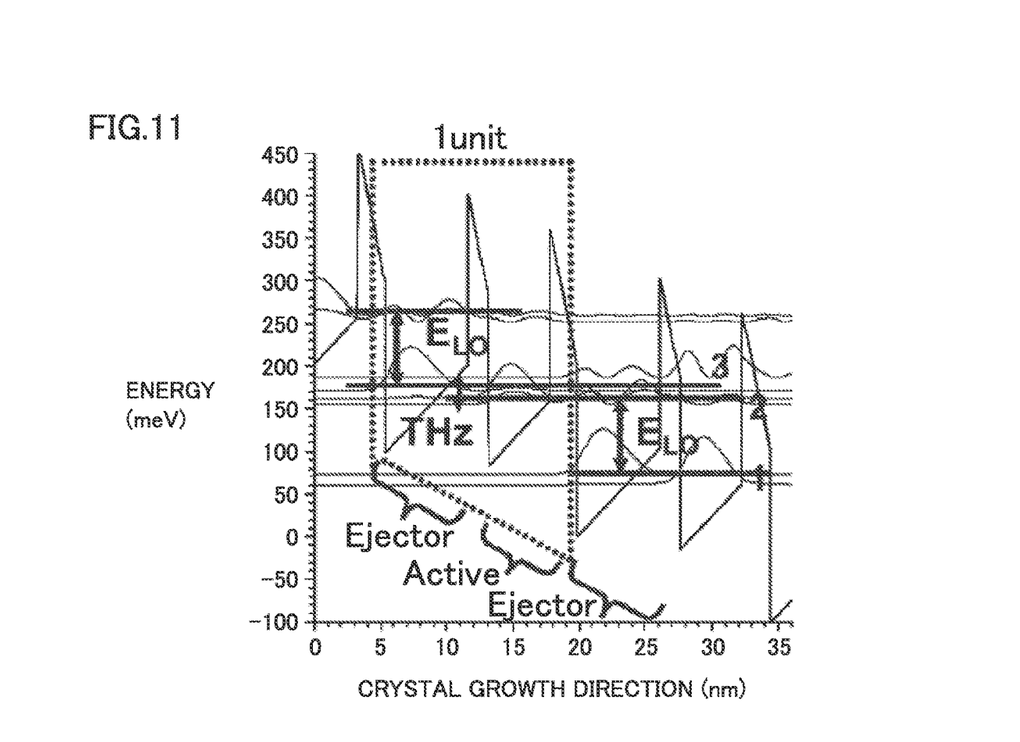
FIG. 11 is a graph illustrating a spectral function of a QCL disclosed in PTL 1.

FIG. 11 illustrates a spectral function of a GaN-based THz-QCL disclosed in PTL 1. In this GaN-based THz-QCL, an AlGaN/GaN-based MQW structure is formed on an upper surface of a c-plane GaN layer. FIG. 11 illustrates a spectral function in a state in which a bias voltage is applied to a degree that lasing can be caused. The "1 unit" illustrated in FIG. 11 includes two quantum well layers. In the state in which a bias voltage is applied to a degree that lasing can be caused, the energy level (3) of the quantum well layer on the left side is higher than the energy level (2) of the quantum well layer on the right side (FIG. 11). However, the quantum well width of the quantum well layer on the right side is smaller than the quantum well width of the quantum well layer on the left side, and thus the quantum well layer on the right side has a larger quantum confinement effect than the quantum well layer on the left side. In a state in which the bias voltage is not applied, therefore, the energy level (2) of the quantum well layer on the right side is higher than the energy level (3) of the quantum well layer on the left side. In other words, during the change in the state from no application of bias voltage to application of bias voltage to a degree that lasing can be caused, there is a state (resonant state) in which the energy at the ground level of the quantum well layer on the left side is substantially equal to the energy at the ground level of the quantum well layer on the right side.

In the resonant state, the movement of carriers between the quantum well layer on the left side and the quantum well layer on the right side occurs because of tunneling, and therefore the resistance is substantially decreased. That is, in a state in which the bias voltage is slightly lower than that in the resonant state and in a state in which the bias voltage is slightly higher than that in the resonant state, the resistance is higher than that in the resonant state. Therefore, if the resonant state is generated while a bias voltage lower than the bias voltage required for lasing is applied, the operation of a laser becomes unstable. Thus, it can be expected that the operation of the QCL disclosed in PTL 1 tends to become unstable.

PTL 1 does not disclose any restriction concerning the configuration of a barrier layer. Since QCLs are operated by tunneling of carriers through a barrier layer, the configuration of a barrier layer is as important as the configuration of a quantum well layer. If the configuration of a barrier layer is not appropriately selected, carriers that have leaked out to the barrier layer are subjected to nonradiative relaxation by LO phonon scattering between the upper lasing level and the lower lasing level, which sometimes suppresses lasing.

Accordingly, it is an object of the present invention to provide a QCL capable of stably causing lasing at room temperature.

Solution to Problem

A quantum cascade laser according to the present invention includes a first electrode, a first contact layer that is in contact with the first electrode and is made of a first compound semiconductor, a second electrode having a polarity opposite to that of the first electrode, a second contact layer that is in contact with the second electrode and is made of a second compound semiconductor, and an active layer disposed between the first contact layer and the second contact layer and including two or more active layer units. Each of the active layer units includes one or more quantum well layers made of a third compound semiconductor and one or more barrier layers made of a fourth compound semiconductor, and each of the quantum well layers and each of the barrier layers are alternately stacked. The vibrational energies of longitudinal optical phonons of the third compound semiconductor and the fourth compound semiconductor are higher than the vibrational energy of a longitudinal optical phonon of GaAs and lower than or equal to the vibrational energy of a longitudinal optical phonon of AlN.

The third compound semiconductor is preferably $Al_{x3}In_{y3}Ga_{(1-x3-y3)}N$ ($0 \leq x3 \leq 1$, $0 \leq y3 \leq 1$). The fourth compound semiconductor is preferably $Al_{x4}In_{y4}Ga_{(1-x4-y4)}N$ ($0 \leq x4 \leq 1$, $0 \leq y4 \leq 1$). The fourth compound semiconductor preferably has a band gap energy higher than that of the third compound semiconductor.

At least one of the barrier layers preferably has a thickness of 1.8 nm or more. More preferably, the barrier layer having a thickness of 1.8 nm or more is disposed between a quantum well layer constituting an upper lasing level and a quantum well layer constituting a lower lasing level.

All the barrier layers included in the active layer preferably have a thickness of 1.8 nm or more and 6.5 nm or less.

Each of the active layer units preferably includes three or more of the quantum well layers and three or more of the barrier layers and more preferably includes three of the quantum well layers and three of the barrier layers.

The main surface of each of the quantum well layers and the main surface of each of the barrier layers preferably have an orientation different from a (0001) orientation and more preferably have an off-angle of ±1° with respect to a (1-100) orientation.

The quantum cascade laser preferably further includes a supporting substrate bonded to the first electrode or the second electrode or a supporting substrate electrically connected to the first electrode or the second electrode.

A metal layer is preferably disposed between the first electrode and the second electrode. The metal layer is preferably disposed in at least one of the first contact layer and the second contact layer. At least one of the first contact layer and the second contact layer is preferably formed by selective growth using the metal layer as a mask.

Advantageous Effects of Invention

In the QCL according to the present invention, lasing can be stably caused at room temperature.

DESCRIPTION OF EMBODIMENTS

Hereafter, the present invention will be described with reference to the attached drawings. Although a QCL that generates electromagnetic waves in the terahertz range will be described below, a QCL of the present invention is not limited to the QCL that generates electromagnetic waves in the terahertz range. In the drawings of the present invention, the same reference numerals denote the same parts or the corresponding parts. The dimensions such as length, width, thickness, and depth are appropriately changed to clarify and simplify the drawings, and do not correspond to the actual dimensions.

First Embodiment

[Structure of QCL]

Figure 1:
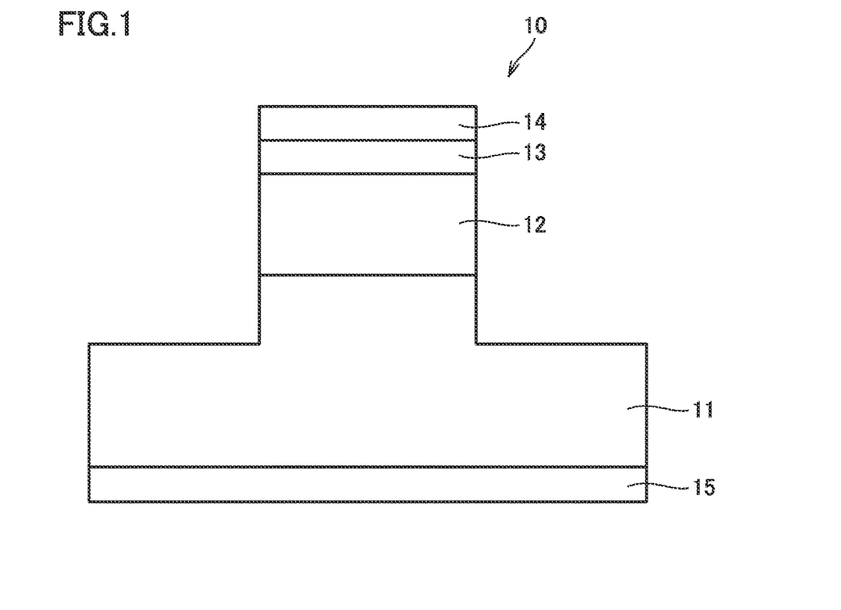
FIG. 1 is a sectional view of a QCL according to an embodiment of the present invention.

FIG. 1 is a sectional view of a QCL 10 according to a first embodiment of the present invention. The QCL 10 includes a first contact layer 11, an active layer 12 disposed on an upper surface of the first contact layer 11, a second contact layer 13 disposed on an upper surface of the active layer 12, an upper electrode (second electrode) 14 in contact with an upper surface of the second contact layer 13, and a lower electrode (first electrode) 15 in contact with a lower surface of the first contact layer 11. The active layer 12 includes two or more active layer units stacked on top of each other. Each of the active layer units includes one or more quantum well layers and one or more barrier layers, and each of the quantum well layers and each of the barrier layers are alternately stacked.

A part of the first contact layer 11 on the upper surface side, the active layer 12, and the second contact layer 13 are etched so that the QCL 10 has a mesa shape with a width of, for example, 10 μm. Thus, a waveguide is formed. The width of the waveguide may be changed in accordance with the use of the QCL 10. The width "10 μm" is merely an example of the width of a waveguide that allows single-mode oscillation of electromagnetic waves in the terahertz range.

<Substrate>

The first contact layer 11 is made of a compound semiconductor (first compound semiconductor) substrate. The first compound semiconductor is preferably represented by general formula $Al_{x1}In_{y1}Ga_{(1-x1-y1)}N$ ($0 \leq x1 \leq 1$, $0 \leq y1 \leq 1$). More preferably, the first compound semiconductor is a material having a lattice constant close to that of a material used for quantum well layers described later. That is, the first compound semiconductor is GaN, InN, a fourth compound semiconductor described later, or a material having a lattice constant that is between the lattice constant of GaN or InN and the lattice constant of the fourth compound semiconductor.

The first contact layer 11 is, for example, preferably an m-plane free-standing GaN substrate. More preferably, the first contact layer 11 is an m-plane free-standing GaN substrate polished after being cut so that the upper surface of the substrate has a (1–100) orientation. Thus, an AlGaN/GaN-based MQW structure having good crystal quality can be grown. The first contact layer 11 may be an m-plane free-standing GaN substrate polished after being cut so that the upper surface of the substrate has an off-angle of ±1° with respect to a (1–100) orientation. Also in this case, the present inventors have confirmed that an AlGaN/GaN-based MQW structure having good crystal quality can be grown.

The first contact layer 11 may be an m-plane free-standing InN substrate. More preferably, the first contact layer 11 is an m-plane free-standing InN substrate polished after being cut so that the upper surface of the substrate has a (1–100) orientation. Thus, an InGaN/InN-based MQW structure having good crystal quality can be grown. The first contact layer 11 may be an m-plane free-standing InN substrate polished after being cut so that the upper surface of the substrate has an off-angle of ±1° with respect to a (1–100) orientation. Also in this case, the present inventors have confirmed that an InGaN/InN-based MQW structure having good crystal quality can be grown.

The first contact layer 11 preferably contains an n-type dopant (e.g., Si). This decreases the resistance of the first contact layer 11 itself and also the contact resistance between the first contact layer 11 and the lower electrode 15. The n-type dopant concentration in the first contact layer 11 is preferably $1 \times 10^{17}/cm^3$ or more and $5 \times 10^{19}/cm^3$ or less and more preferably $1 \times 10^{17}/cm^3$ or more and $3 \times 10^{18}/cm^3$ or less.

The thickness of the first contact layer 11 (the distance from the contact surface between the first contact layer 11 and the lower electrode 15 to the contact surface between the first contact layer 11 and the active layer 12) is preferably 0.1 μm or more and 500 μm or less and more preferably 0.1 μm or more and 50 μm or less.

<Active Layer>
(Quantum Well Layer)

The quantum well layer of the active layer 12 is made of a compound semiconductor (third compound semiconductor). The vibrational energy of LO phonons of the third compound semiconductor is higher than the vibrational energy of LO phonons of GaAs and lower than or equal to the vibrational energy of LO phonons of AlN.

When the vibrational energy of LO phonons of the third compound semiconductor is higher than the vibrational energy of LO phonons of GaAs, the difference in energy between carriers thermally excited to a level higher than the bottom of the energy band of the upper lasing level and the lower lasing level is smaller than the vibrational energy of LO phonons of the third compound semiconductor. This prevents the transition of thermally excited carriers to the lower lasing level by LO phonon scattering. That is, the thermally excited carriers can be prevented from losing energy as a result of LO phonon scattering. Thus, even when the QCL 10 is operated at room temperature, nonradiative transition can be prevented.

Figure 3:
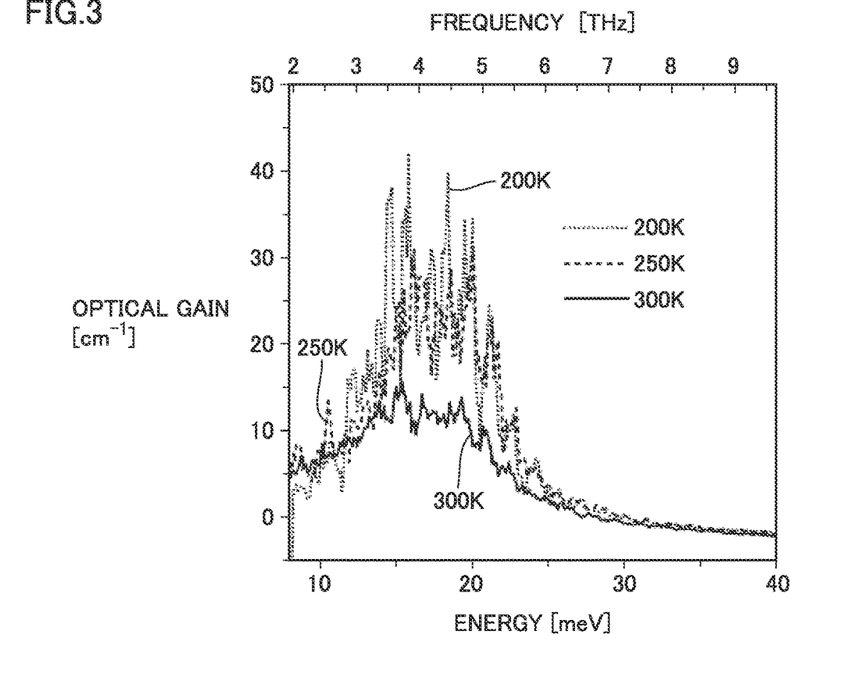
FIG. 3 is a graph illustrating a gain spectrum of an active layer according to an embodiment of the present invention.

Furthermore, if the transition of the thermally excited carriers to the lower lasing level by LO phonon scattering can be prevented, carriers that have lost energy can be prevented from occupying the lower lasing level. This facilitates formation of population inversion, which allows lasing. Accordingly, lasing can be stably caused even at room temperature in the QCL 10 (FIG. 3 described later).

When the vibrational energy of LO phonons of the third compound semiconductor is lower than or equal to the vibrational energy of LO phonons of AlN, an excessive increase in scattering probability by LO phonons can be prevented, which suppresses energy broadening associated with the uncertainty principle. Thus, a decrease in gain due to energy broadening can be suppressed.

Such a third compound semiconductor is preferably represented by general formula $Al_{x3}In_{y3}Ga_{(1-x3-y3)}N$ ($0 \leq x3 \leq 1$, $0 \leq y3 \leq 1$). The third compound semiconductor is more preferably GaN or $Al_{x3}In_{y3}Ga_{(1-x3-y3)}N$ with at least one of x3 and y3 being controlled so as to provide a lattice constant close to the lattice constant of the first compound semiconductor, which is a material for the first contact layer 11. When the first contact layer 11 is a GaN substrate such as an m-plane free-standing GaN substrate, the third compound semiconductor is preferably GaN. This improves the crystal quality of the quantum well layer made of GaN. When the first contact layer 11 is an InN substrate such as an m-plane free-standing InN substrate, the third compound semiconductor is preferably InN. This improves the crystal quality of the quantum well layer made of InN.

The thickness of the quantum well layer is preferably 1 nm or more and 100 nm or less and more preferably 1 nm or more and 6.5 nm or less. Thus, optical gain due to intersubband transition can be obtained.

The quantum well layers of each of the active layer units may have the same thickness or different thicknesses. For example, the thickness of the quantum well layer constituting the upper lasing level is preferably 1 nm or more and 7 nm or less and more preferably 1.5 nm or more and 3.5 nm or less. The thickness of the quantum well layer constituting the lower lasing level is preferably 1 nm or more and 7 nm or less and more preferably 1.5 nm or more and 3.5 nm or less. The thickness of the quantum well layer constituting the carrier-extraction level is preferably 1 nm or more and 20 nm or less and more preferably 4 nm or more and 12 nm or less.

The main surface of the quantum well layer (the surface of the quantum well layer on which the barrier layer is formed) preferably has an orienntation different from a (0001)

orientation. Thus, a low internal electric field can be achieved in the QCL 10 compared with the case where the main surface of the quantum well layer has a (0001) orientation. This makes it easy to design the QCL 10. Furthermore, even if a plurality of quantum well layers included in the active layer 12 have different thicknesses or compositions, the performance of the QCL 10 can be prevented from degrading.

More preferably, the main surface of the quantum well layer has a (1−100) orientation. Thus, the internal electric field is decreased to a negligible degree in the QCL 10, and the crystal growth is easily performed. This makes it easy to design the QCL 10. Herein, the present inventors have confirmed that even when the main surface of the quantum well layer has an off-angle of ±1° with respect to a (1−100) orientation, the internal electric field can be decreased to a negligible degree in the QCL 10, and the crystal growth is easily performed.

(Barrier Layer)

The barrier layer of the active layer 12 is made of a compound semiconductor (fourth compound semiconductor). The vibrational energy of LO phonons of the fourth compound semiconductor is higher than the vibrational energy of LO phonons of GaAs and lower than or equal to the vibrational energy of LO phonons of AlN.

In the case where the vibrational energy of LO phonons of the fourth compound semiconductor is higher than the vibrational energy of LO phonons of GaAs, even if carriers thermally excited to a level higher than the bottom of the energy band of the upper lasing level leak out to the barrier layer, the carriers can be prevented from losing energy as a result of LO phonon scattering. Thus, even when the QCL 10 is operated at room temperature, nonradiative transition can be effectively prevented.

When the vibrational energy of LO phonons of the fourth compound semiconductor is lower than or equal to the vibrational energy of LO phonons of AlN, an excessive increase in scattering probability by LO phonons can be prevented, which suppresses energy broadening through the uncertainty principle. Thus, a decrease in gain due to energy broadening can be suppressed.

Such a fourth compound semiconductor is preferably represented by general formula $Al_{x4}In_{y4}Ga_{(1-x4-y4)}N$ ($0 \leq x4 \leq 1$, $0 \leq y4 \leq 1$). The fourth compound semiconductor also preferably has a band gap energy higher than that of the third compound semiconductor constituting the quantum well layer. Accordingly, when the third compound semiconductor is GaN, the fourth compound semiconductor is preferably AlGaN. When the third compound semiconductor is InN, the fourth compound semiconductor is preferably InGaN. When the third compound semiconductor is $Al_{x3}Ga_{(1-x3)}N$ ($0<x3<1$), the fourth compound semiconductor is preferably AlN.

The thickness of the barrier layer is preferably 1 nm or more and 10 nm or less and more preferably 1.8 nm or more and 6.5 nm or less. This provides optical gain due to intersubband transition.

At least one of the barrier layers preferably has a thickness of 1.8 nm or more. This prevents nonradiative transition of carriers to a different level due to elastic scattering (e.g., impurity scattering or roughness scattering). Therefore, the lasing at room temperature can be further stabilized. More preferably, all the barrier layers included in the active layer 12 have a thickness of 1.8 nm or more. This further prevents nonradiative transition of carriers to a different level due to elastic scattering, and thus the lasing at room temperature can be further stabilized.

Figure 2:
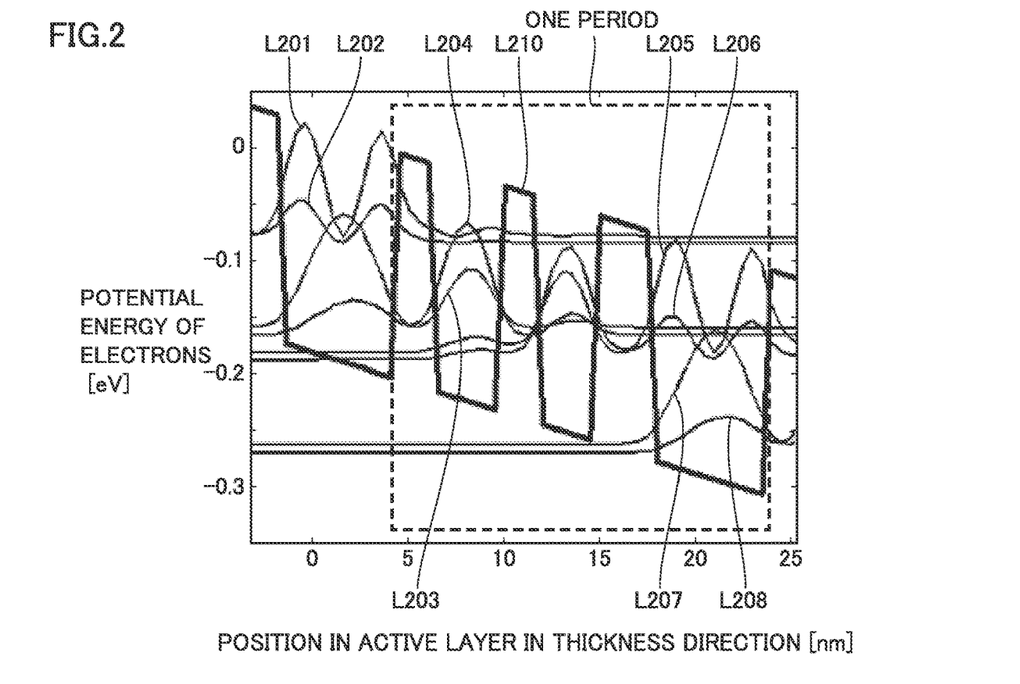
FIG. 2 illustrates the energy band structure and the shape of a wave function of an active layer according to an embodiment of the present invention.

More preferably, the barrier layer having a thickness of 1.8 nm or more is disposed between the quantum well layer constituting the upper lasing level and the quantum well layer constituting the lower lasing level. This decreases the overlap between the wave function of the upper lasing level and the wave function of the lower lasing level (FIG. 2 below). Therefore, the nonradiative transition (nonradiative transition due to elastic scattering such as impurity scattering or roughness scattering) from the upper lasing level to the lower lasing level can be prevented. However, an excessive decrease in the overlap between the wave function of the upper lasing level and the wave function of the lower lasing level because of the large thickness of the barrier layer makes it difficult to efficiently cause stimulated emission. Therefore, the thickness of the barrier layer needs to be controlled to an appropriate thickness. By controlling the thickness of the barrier layer to an appropriate thickness, the lasing at room temperature can be further stabilized. More preferably, a barrier layer having a thickness of 1.8 nm or more and 3.0 nm or less is disposed between the quantum well layer constituting the upper lasing level and the quantum well layer constituting the lower lasing level.

All the barrier layers included in the active layer 12 preferably have a thickness of 6.5 nm or less. This prevents an excessive increase in the thickness of each active layer unit, and thus lasing can be caused at a low threshold value. In each active layer unit, the barrier layers may have the same thickness or different thicknesses.

The main surface of the barrier layer (the surface of the barrier layer on which the quantum well layer is formed) preferably has an orientation different from a (0001) orientation. This suppresses the internal electric field in the QCL 10 compared with the case where the main surface of the barrier layer has a (0001) orientation. Thus, the QCL 10 is easily designed. Furthermore, even if a plurality of barrier layers included in the active layer 12 have different thicknesses or compositions, the performance of the QCL 10 can be prevented from degrading.

More preferably, the main surface of the barrier layer has a (1−100) orientation. Thus, the internal electric field is decreased to a negligible degree in the QCL 10, and the crystal growth is easily performed. This makes it easy to design the QCL 10. Herein, the present inventors have confirmed that even when the main surface of the barrier layer has an off-angle of ±1° with respect to a (1−100) orientation, the internal electric field can be decreased to a negligible degree in the QCL 10, and the crystal growth is easily performed.

The number of active layer units in the active layer 12 is not particularly limited. The number of the quantum well layers and the number of the barrier layers in each of the active layer units are not particularly limited.

Each of the active layer units preferably includes three or more of the quantum well layers and three or more of the barrier layers. This suppresses a decrease in the resistance at a lasing threshold value or lower, which stably causes lasing.

More preferably, each of the active layer units includes three of the quantum well layers and three of the barrier layers. This stably causes lasing. Furthermore, a large region where optical gain is generated can be ensured in each of the active layer units, and thus lasing can be caused at a low threshold value.

When the third compound semiconductor is GaN and the fourth compound semiconductor is AlGaN, the generation of the above-described resonant state can be sometimes prevented until the bias voltage increases to a bias voltage at which the maximum optical gain is maximized (refer to FIG. 4 described below). Thus, the lasing can be further stabilized at room temperature.

When the third compound semiconductor is InN and the fourth compound semiconductor is InGaN, the optical gain is sometimes present in the above-described resonant state (refer to FIG. 6 described below). By optimizing the bias voltage, the lasing can be further stabilized at room temperature.

The thickness of the active layer 12 is preferably 0.5 µm or more and 100 µm or less and more preferably 1 µm or more and 20 µm or less.

<Second Contact Layer>

The second contact layer 13 is made of a compound semiconductor (second compound semiconductor). The second compound semiconductor is preferably represented by general formula $Al_{x2}In_{y2}Ga_{(1-x2-y2)}N$ ($0 \leq x2 \leq 1$, $0 \leq y2 \leq 1$). More preferably, the second compound semiconductor is a material having a lattice constant close to that of a material used for the above-described quantum well layer. That is, the second compound semiconductor is GaN, InN, the above-described fourth compound semiconductor, or a material having a lattice constant that is between the lattice constant of GaN or InN and the lattice constant of the fourth compound semiconductor.

The second contact layer 13 preferably contains an n-type dopant (e.g., Si). This decreases the resistance of the second contact layer 13 itself and also the contact resistance between the second contact layer 13 and the upper electrode 14. The n-type dopant concentration in the second contact layer 13 is preferably $1 \times 10^{17}/cm^3$ or more and $1 \times 10^{20}/cm^3$ or less and more preferably $1 \times 10^{18}/cm^3$ or more and $5 \times 10^{19}/cm^3$ or less.

The thickness of the second contact layer 13 is preferably 0.05 µm or more and 3 µm or less and more preferably 0.1 µm or more and 1 µm or less.

<Upper Electrode and Lower Electrode>

The upper electrode 14 is preferably made of a metal material having good ohmic characteristics with the second contact layer 13. The upper electrode 14 is, for example, an ohmic electrode including Ti layers and Al layers stacked on top of each other. The upper electrode 14 may be made of a metal different from Ti and Al or may be a transparent oxide electrode.

The lower electrode 15 is preferably made of a metal material having good ohmic characteristics with the first contact layer 11. The lower electrode 15 is, for example, an ohmic electrode including Ti layers and Al layers stacked on top of each other. The lower electrode 15 may be made of a metal different from Ti and Al or may be a transparent oxide electrode.

<Verification of Effects (1)>

The effects of this embodiment were verified by simulation. In this simulation, a single-band Hamiltonian was assumed as an electron Hamiltonian, and Schrödinger's equation and Poisson's equation were solved by a self-consistent calculation method. Thus, the potential energy and wave function of electrons obtained when a bias voltage of about 95 meV per active layer unit was applied were calculated. FIG. 2 illustrates the calculation results.

In FIG. 2, the horizontal axis shows a position in the active layer in a thickness direction and the vertical axis shows the potential energy of electrons. "One period" enclosed in a dotted line corresponds to a single active layer unit. L201 to L208 show energy levels (calculated results). In each of L201 to L208, the value on the vertical axis is the potential energy of electrons and the shape corresponds to a shape of the wave function. Furthermore, L210 shows an energy band structure (calculated results) of the active layer.

In the simulation, a structure formed by connecting many active layer units was used as a structure of the active layer by applying periodic boundary conditions to a one-period active layer unit (single active layer unit). The one-period active layer unit includes three quantum well layers and three barrier layers, and each of the quantum well layers and each of the barrier layers are alternately stacked. The composition and thickness of each of the quantum well layers and the composition and thickness of each of the barrier layers were as follows. The "first layer" described later is a leftmost layer in the region enclosed in a dotted line in FIG. 2. The "sixth layer" described later is a rightmost layer in the region enclosed in a dotted line in FIG. 2 and contains Si in a concentration of $3 \times 10^{17}/cm^3$ in order to generate electrons.

First layer (barrier layer): $Al_{0.2}Ga_{0.8}N$ (thickness: 2.0 nm)

Second layer (quantum well layer): GaN (thickness: 3.5 nm)

Third layer (barrier layer): $Al_{0.2}Ga_{0.8}N$ (thickness: 2.0 nm)

Fourth layer (quantum well layer): GaN (thickness: 3.0 nm)

Fifth layer (barrier layer): $Al_{0.2}Ga_{0.8}N$ (thickness: 3.0 nm)

Sixth layer (quantum well layer): GaN (thickness: 6.0 nm)

As illustrated in FIG. 2, the active layer unit included in the region enclosed in a dotted line formed the energy levels L203 to L208. The energy levels L203 and L204 are upper lasing levels, the energy levels L205 and L206 are lower lasing levels, and the energy levels L207 and L208 are carrier-extraction levels. The energy levels L201 and L202 are carrier-extraction levels in an active layer unit located on the left side of the active layer unit included in the region enclosed in a dotted line in FIG. 2.

When carriers are injected into the energy levels L203 and L204 from the active layer unit located on the left side of the active layer unit included in the region enclosed in a dotted line in FIG. 2, the carriers are subjected to stimulated emission from the energy levels L203 and L204 toward the energy levels L205 and L206 (radiative transition). Then, the carriers reach the sixth layer (quantum well layer) by tunneling and are scattered by LO phonons (the vibrational energy of LO phonons of GaN is 92 meV) to cause transition to the energy levels L207 and L208. The carriers subjected to the transition to the energy levels L207 and L208 are injected into an active layer unit located on the right side of the active layer unit included in the region enclosed in a dotted line in FIG. 2. The above-described processes are repeatedly conducted.

As illustrated in FIG. 2, the second layer forms the upper lasing level and the fourth layer forms the lower lasing level. Herein, the third layer located between the second layer and the fourth layer has a thickness of 2.0 nm. This suppresses the nonradiative transition from the upper lasing level to the lower lasing level due to elastic scattering such as impurity scattering or roughness scattering. It has been found from the calculation conducted by the present inventors that such an effect is considerably produced when the barrier layer disposed between the quantum well layer that forms the upper lasing level and the quantum well layer that forms the lower lasing level has a thickness of 1.8 nm or more. This is because a thickness of 1.8 nm or more of the barrier layer sharply weakens the bond between the quantum well layer that forms the upper lasing level and the quantum well layer that forms the lower lasing level. In other words, the overlap between the wave function of the upper lasing level and the wave function of the lower lasing level decreases (FIG. 2).

FIG. 3 illustrates the optical gain obtained when a bias voltage of about 95 meV per active layer unit was applied, the optical gain being calculated by a nonequilibrium Green's function method. It is clear from the results that even when a QCL including the above-described active layer units is operated at 300 K, optical gain is obtained in a wide frequency range of 2.5 to 6 THz. In particular, in a frequency range of 3.2 to 4.8 THz, the optical gain exceeds 10 cm$^{-1}$ and the maximum optical gain is about 15 cm$^{-1}$. Thus, it has been found that the QCL including the above-described active layer units has optical gain sufficient for lasing at room temperature.

Figure 4:
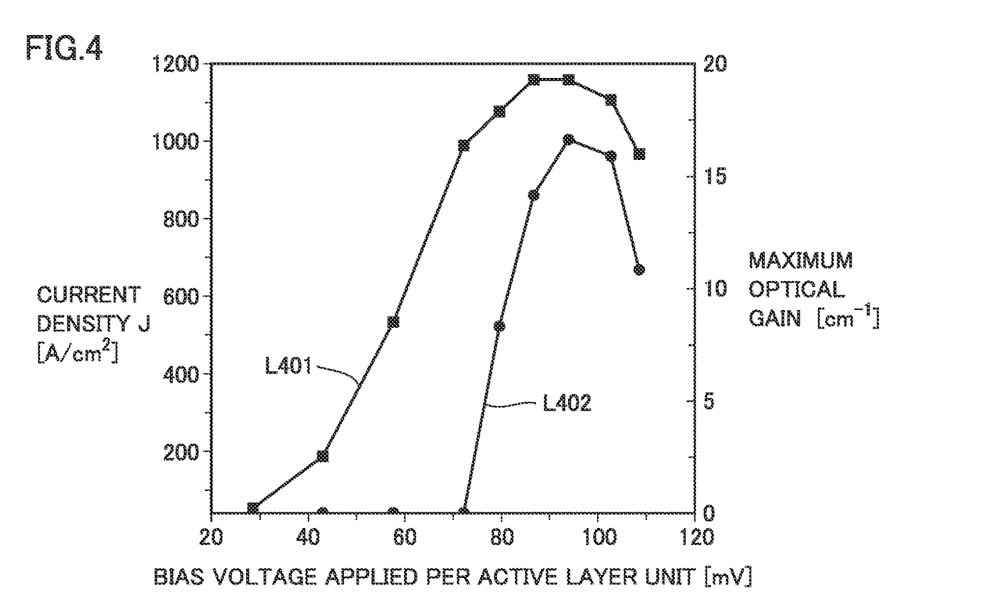
FIG. 4 is a graph illustrating the relationship between a bias voltage applied per active layer unit according to an embodiment of the present invention and the current density J and maximum optical gain.

FIG. 4 illustrates the relationship (calculation results) between the bias voltage applied per active layer unit and the current density J and maximum optical gain when a QCL including the above-described active layer units was operated at 300 K. In FIG. 4, L401 shows the relationship between the bias voltage and the current density J, and L402 shows the relationship between the bias voltage and the maximum optical gain. As illustrated in FIG. 4, a decrease in the current density J has not been confirmed until the bias voltage increases to a value (about 95 meV) at which the maximum optical gain is maximized. In view of these results, it is believed that when the QCL including the above-described active layer units is operated at room temperature (300 K), electromagnetic waves in the terahertz range can be stably caused to oscillate.

<Verification of Effects (2)>

Figure 5:
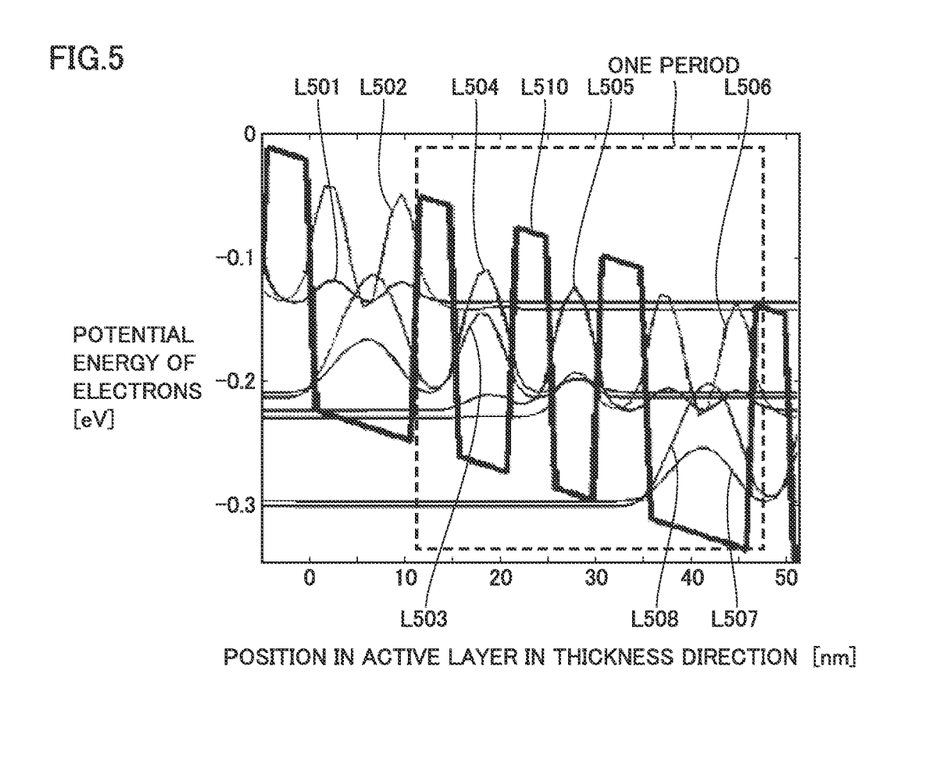
FIG. 5 illustrates the energy band structure and the shape of a wave function of an active layer according to an embodiment of the present invention.

The structure of the active layer units was changed and the effects of this embodiment were verified. In this simulation, a single-band Hamiltonian was assumed as an electron Hamiltonian, and Schrödinger's equation and Poisson's equation were solved by a self-consistent calculation method. Thus, the potential energy and wave function of electrons obtained when a bias voltage of about 80 meV per active layer unit was applied were calculated. FIG. 5 illustrates the calculation results.

In FIG. 5, the horizontal axis shows a position in the active layer in a thickness direction and the vertical axis shows the potential energy of electrons. "One period" enclosed in a dotted line corresponds to a single active layer unit. L501 to L508 show energy levels (calculated results). In each of L501 to L508, the value on the vertical axis is the potential energy of electrons and the shape corresponds to a shape of the wave function. Furthermore, L510 shows an energy band structure (calculated results) of the active layer.

The composition and thickness of each of the quantum well layers and the composition and thickness of each of the barrier layers were as follows. The "first layer" described later is a leftmost layer in the region enclosed in a dotted line in FIG. 5. The "sixth layer" described later is a rightmost layer in the region enclosed in a dotted line in FIG. 5 and contains Si in a concentration of 3×10$^{17}$/cm$^3$ in order to generate electrons.

First layer (barrier layer): In$_{0.9}$Ga$_{0.1}$N (thickness: 4.0 nm)
Second layer (quantum well layer): InN (thickness: 6.0 nm)
Third layer (barrier layer): In$_{0.9}$Ga$_{0.1}$N (thickness: 4.0 nm)
Fourth layer (quantum well layer): InN (thickness: 5.0 nm)
Fifth layer (barrier layer): In$_{0.9}$Ga$_{0.1}$N (thickness: 5.0 nm)
Sixth layer (quantum well layer): InN (thickness: 11.0 nm)

As illustrated in FIG. 5, the active layer unit included in the region enclosed in a dotted line formed the energy levels L503 to L508. The energy levels L503 and L504 are upper lasing levels, the energy levels L505 and L506 are lower lasing levels, and the energy levels L507 and L508 are carrier-extraction levels. The energy levels L501 and L502 are carrier-extraction levels in an active layer unit located on the left side of the active layer unit included in the region enclosed in a dotted line in FIG. 5.

When carriers are injected into the energy levels L503 and L504 from the active layer unit located on the left side of the active layer unit included in the region enclosed in a dotted line in FIG. 5, the carriers are subjected to stimulated emission from the energy levels L503 and L504 toward the energy levels L505 and L506 (radiative transition). Then, the carriers reach the sixth layer (quantum well layer) by tunneling and are scattered by LO phonons (the vibrational energy of LO phonons of InN is 72.6 meV) to cause transition to the energy levels L507 and L508. The carriers subjected to the transition to the energy levels L507 and L508 are injected into an active layer unit located on the right side of the active layer unit included in the region enclosed in a dotted line in FIG. 5. The above-described processes are repeatedly conducted.

As illustrated in FIG. 5, the second layer forms the upper lasing level and the fourth layer forms the lower lasing level. Herein, the third layer located between the second layer and the fourth layer has a thickness of 4.0 nm. Therefore, the overlap between the wave function of the upper lasing level and the wave function of the lower lasing level is believed to be considerably small. This suppresses the nonradiative transition from the upper lasing level to the lower lasing level due to elastic scattering such as impurity scattering or roughness scattering.

The optical gain obtained when a bias voltage of about 80 meV per active layer unit is applied is calculated by a nonequilibrium Green's function method. It has been found that the optical gain is maximized (20 cm$^{-1}$) at a frequency of about 3 THz.

Figure 6:
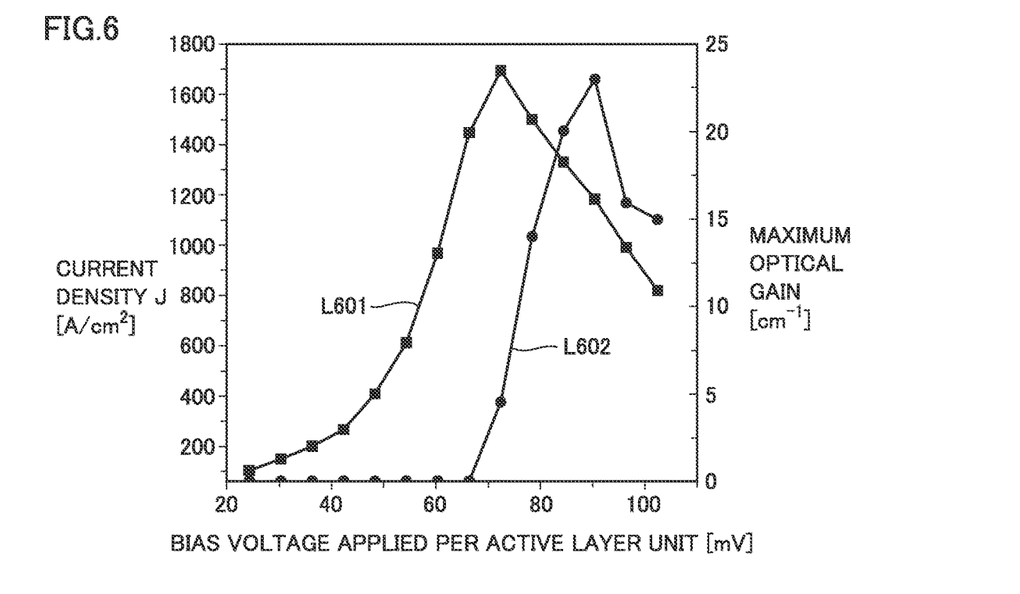
FIG. 6 is a graph illustrating the relationship between a bias voltage applied per active layer unit according to an embodiment of the present invention and the current density J and maximum optical gain.

FIG. 6 illustrates the relationship (calculation results) between the bias voltage applied per active layer unit and the current density J and maximum optical gain when a QCL including the above-described active layer units was operated at 300 K. In FIG. 6, L601 shows the relationship between the bias voltage and the current density J, and L602 shows the relationship between the bias voltage and the maximum optical gain. As illustrated in FIG. 6, a decrease in the current density J has been confirmed at a bias voltage of about 73 meV, which is a bias voltage just before a bias voltage (about 90 meV) at which the maximum optical gain is maximized. Therefore, if a bias voltage of about 90 meV per active layer unit is applied, lasing may become unstable. However, even when a bias voltage of about 73 meV per active layer unit is applied, optical gain is still present. Accordingly, it is believed that lasing can be caused by applying a bias voltage of about 73 meV per active layer unit even at room temperature.

[Production of QCL]

First, an active layer 12 and a second contact layer 13 are formed on an upper surface of a first contact layer 11 by, for example, a molecular beam epitaxy (MBE) method or a metal organic vapor phase epitaxy (MOVPE) method. Then, an upper electrode 14 is formed on an upper surface of the second contact layer 13 and a lower electrode 15 is formed on a lower surface of the first contact layer 11 by, for example, an electron-beam deposition method. Then, the upper electrode 14, the second contact layer 13, the active layer 12, and a part of the first contact layer 11 are etched by, for example, a reactive ion etching (RIE) method to form a mesa shape illustrated in FIG. 1. Thus, a QCL in FIG. 1 is produced.

Second Embodiment

Figure 7:
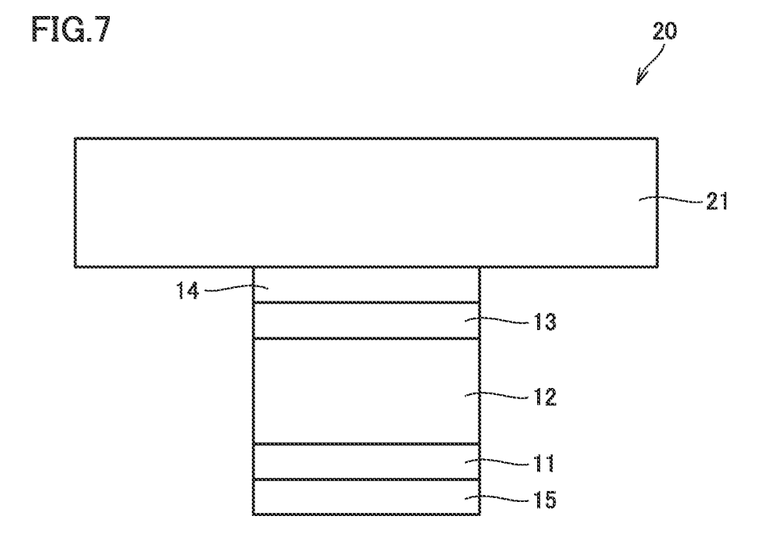
FIG. 7 is a sectional view of a QCL according to an embodiment of the present invention.

FIG. 7 is a sectional view of a QCL 20 according to a second embodiment of the present invention. In the QCL 20, a supporting substrate 21 is disposed on an upper surface of an upper electrode 14. Hereafter, points different from those in the first embodiment will be mainly described.

The supporting substrate 21 is bonded to the upper electrode 14 or is electrically connected to the upper electrode 14. When the QCL 20 includes the supporting substrate 21, the thickness of the first contact layer 11 can be decreased. For example, the thickness of the first contact layer 11 can be decreased to 10 μm or less. Since the distance between the upper electrode 14 and the lower electrode 15 is decreased, the ratio of a region where optical gain is generated in the active layer unit can be increased. Thus, highly efficient lasing can be achieved. For example, lasing can be caused at a low threshold value.

The QCL 20 can be produced by the following method. First, the upper electrode 14 is formed by the method described in the first embodiment. Then, a supporting substrate 21 is fixed onto an upper surface of the upper electrode 14 using solder such as AuSn. Subsequently, the lower surface of the first contact layer 11 is polished until the substrate thickness reaches 10 μm or less. Instead of the polishing of the lower surface of the first contact layer 11, the thickness of the first contact layer 11 may be decreased by laser lift-off, chemical etching, or the like. Subsequently, the upper electrode 14, the second contact layer 13, the active layer 12, and the first contact layer 11 are etched from the lower surface side of the first contact layer 11 by, for example, an RIE method. A lower electrode 15 is then formed on the lower surface of the first contact layer 11.

Third Embodiment

[Structure of QCL]

Figure 8:
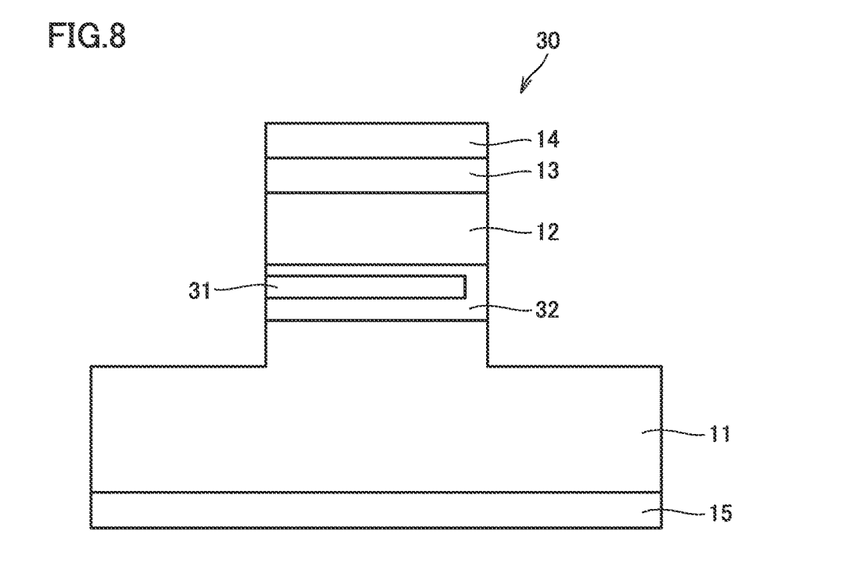
FIG. 8 is a sectional view of a QCL according to an embodiment of the present invention.

FIG. 8 is a sectional view of a QCL 30 according to a third embodiment of the present invention. Hereafter, points different from those in the first embodiment will be mainly described.

<Metal Layer>

A metal layer 31 is disposed between the upper electrode 14 and the lower electrode 15. This increases the confinement factor of electromagnetic waves, which allows lasing at a low threshold value.

This will be described in detail. Electromagnetic waves in the terahertz range have a wavelength of several tens of micrometers to several hundred micrometers. The thickness of the active layer 12 having optical gain required for lasing is several micrometers to ten micrometers, and electromagnetic waves need to be confined in the active layer 12 in order to efficiently cause lasing. If the metal layer 31 is disposed between the upper electrode 14 and the lower electrode 15, electromagnetic waves in the terahertz range can be confined between the metal layer 31 and the upper electrode 14 with more certainty. Consequently, the overlap of electromagnetic waves and the active layer 12 can be increased compared with the QCL 10, that is, the confinement factor of electromagnetic waves is increased. Thus, lasing can be caused at a low threshold value.

More preferably, the metal layer 31 is disposed inside a first contact layer 32. Thus, the metal layer 31 that produces the above effect can be easily formed.

The metal layer 31 may be disposed inside the second contact layer 13. In this case, electromagnetic waves in the terahertz range can be confined between the metal layer 31 and the lower electrode 15 with more certainty. Consequently, the overlap of electromagnetic waves and the active layer 12 can be increased compared with the QCL 10, that is, the confinement factor of electromagnetic waves is increased. Thus, lasing can be caused at a low threshold value, and the metal layer 31 can be easily formed.

The material for the metal layer 31 is preferably a metal (metal with high thermal resistance), such as tungsten (W) or copper (Cu), that is not altered at a growth temperature at which compound semiconductor layers such as the active layer 12 and the second contact layer 13 are subjected to crystal growth.

The thickness of the metal layer 31 is preferably 0.01 μm or more and 1 μm or less and more preferably 0.03 μm or more and 0.2 μm or less.

<First Contact Layer>

The first contact layer 32 preferably has the same composition as the second contact layer 13, preferably contains an n-type dopant in the same concentration as that of the second contact layer 13, and preferably has the same thickness as the second contact layer 13.

[Production of QCL]

Figure 9:
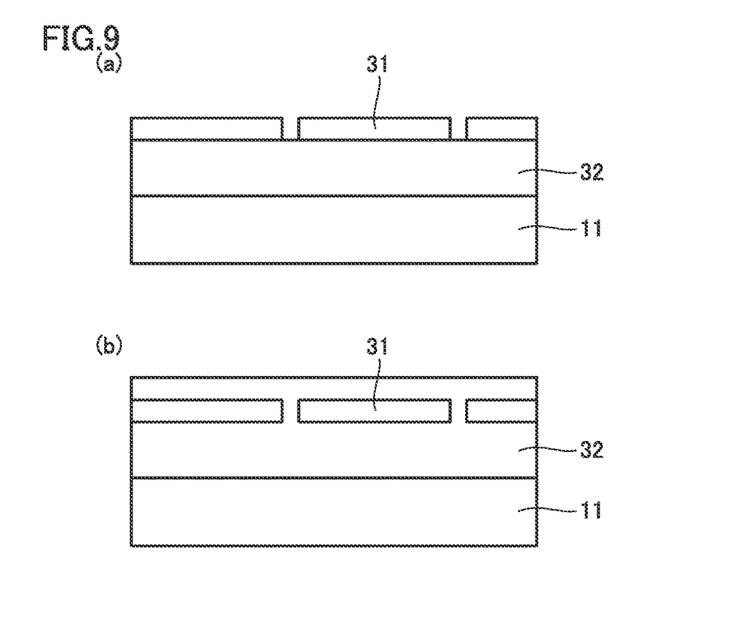
FIG. 9 illustrates sectional views partly illustrating a method for producing a QCL according to an embodiment of the present invention in the order of processes.

FIGS. 9(a) and 9(b) are sectional views partly illustrating a method for producing the QCL 30 in the order of processes. First, a first contact layer 32 is formed on an upper surface of a first contact layer 11, and then a metal layer is formed on the entire upper surface of the first contact layer 32 by, for example, a sputtering method.

Subsequently, the metal layer is patterned by photolithography to form a striped metal layer 31 (FIG. 9(a)). The stripe formed preferably extends in a direction parallel to a (0001) orientation of a compound semiconductor constituting the first contact layer 32 or in a direction perpendicular to the (0001) orientation. The width of openings formed by patterning the metal layer is preferably about 1 μm, and the width of the metal layer 31 is preferably about 20 μm.

The first contact layer 32 is then regrown. The first contact layer 32 grows in a transverse direction, and consequently the metal layer 31 is buried in the first contact layer 32 (FIG. 9(b)). Subsequently, the active layer 12, the second contact layer 13, the upper electrode 14, and the lower electrode 15 are formed by the method described in the first embodiment. Thus, a QCL 30 is produced.

The following technique has been widely known. In the crystal growth of nitride semiconductors using a sapphire substrate or a silicon substrate, selective growth in a transverse direction is promoted using a mask made of a metal or an insulator to form a high-quality thin film. In this case, the mask is formed inside a layer disposed on at least one layer which is different from the active layer and is disposed on the active layer.

When a free-standing substrate is used as the first contact layer 11, the first contact layer 11 is formed of a high-quality crystal. Therefore, if selective growth in a transverse direction is promoted using the known mask, a conductivity type dopant is accidentally doped into the growth layer or formation of crystal defects is facilitated in the growth layer.

However, the metal layer 31 is disposed in a layer (the first contact layer 32 in this embodiment) that is in contact with the active layer 12 in order to increase the confinement factor of electromagnetic waves. Therefore, the configuration of the metal layer 31 is different from that of the above-described mask.

Furthermore, since the first contact layer 32 is grown in a transverse direction using the metal layer 31 as a mask, a conductivity type dopant can be prevented from being accidentally doped into the first contact layer 32, and the facilitated formation of crystal defects in the first contact layer 32 can be prevented.

Fourth Embodiment

Figure 10:
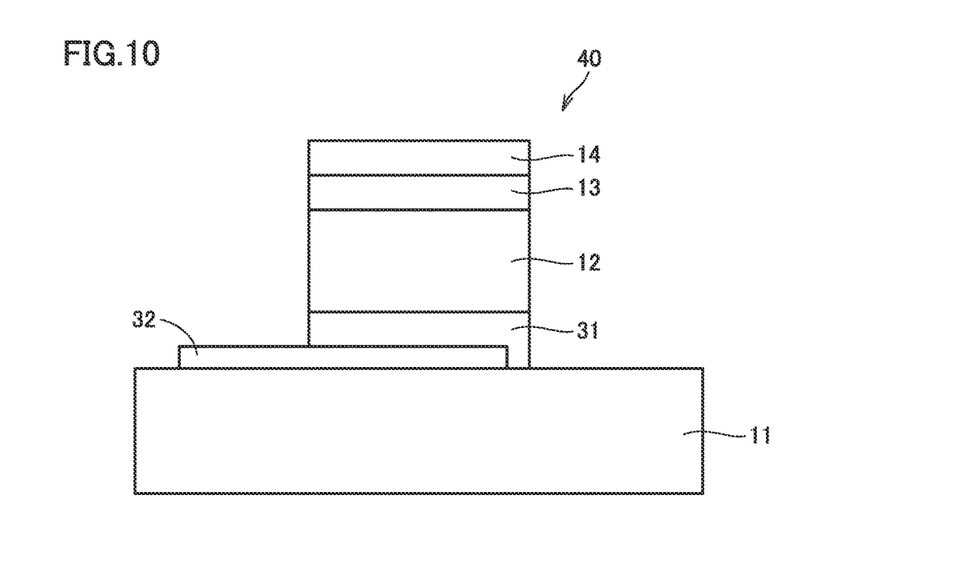
FIG. 10 is a sectional view of a QCL according to an embodiment of the present invention.

FIG. 10 is a sectional view of a QCL 40 according to a fourth embodiment of the present invention. Hereafter, points different from those in the third embodiment will be mainly described.

The metal layer 31 is disposed on the first contact layer 11 with the first contact layer 32 sandwiched therebetween. Since the metal layer 31 is electrically connected to the first contact layer 32, a voltage can be directly applied to the metal layer 31. That is, the metal layer 31 can be used as the lower electrode 15 in the first to third embodiments.

The first contact layer 32 is formed by selective growth using the metal layer 31 as a mask. Therefore, the metal layer 31 functions as a layer for selectively growing the first contact layer 32, functions as a layer for increasing the confinement factor of electromagnetic waves, and functions as a substitute for the lower electrode 15. Thus, the metal layer 31 and the first contact layer 32 can be easily formed.

Other Embodiments

The first contact layer 11 may have an orientation (e.g., a plane ((11−20) orientation)) different from the m plane. The first contact layer 11 may be a composite substrate obtained by forming an m-plane free-standing GaN layer or an m-plane free-standing InN layer on an upper surface of a sapphire substrate or a SiC substrate.

It is known that GaAs-based materials and GaN-based materials, which have been used as materials for QCLs, have considerably different physical properties and characteristics. Therefore, when a QCL is produced using a GaN-based material, the QCL needs to be produced under a design guideline different from before.

In particular, the effective mass of GaN-based materials is large, and thus the broadening of energy levels is much larger in GaN-based materials than in GaAs-based materials. Therefore, if a QCL containing a GaN-based material is produced under the same design guideline as that for producing a QCL using a GaAs-based material, problems occur such as unstable operation of the QCL and impossibility of causing lasing in the QCL. When a QCL containing a GaN-based material is produced under the design guideline described in the above embodiments, the QCL containing a GaN-based material can be stably operated.

[Recapitulation of Embodiments]

The QCL 10 illustrated in FIG. 1 or the like includes a first electrode 15, a first contact layer 11 that is in contact with the first electrode 15 and is made of a first compound semiconductor, a second electrode 14 having a polarity opposite to that of the first electrode 15, a second contact layer 13 that is in contact with the second electrode 14 and is made of a second compound semiconductor, and an active layer 12 disposed between the first contact layer 11 and the second contact layer 13 and including two or more active layer units. Each of the active layer units includes one or more quantum well layers made of a third compound semiconductor and one or more barrier layers made of a fourth compound semiconductor, and each of the quantum well layers and each of the barrier layers are alternately stacked. The vibrational energies of longitudinal optical phonons of the third compound semiconductor and the fourth compound semiconductor are higher than the vibrational energy of a longitudinal optical phonon of GaAs and lower than or equal to the vibrational energy of a longitudinal optical phonon of AlN. Thus, lasing can be stably caused at room temperature.

The third compound semiconductor is preferably $Al_{x3}In_{y3}Ga_{(1-x3-y3)}N$ ($0 \leq x3 \leq 1$, $0 \leq y3 \leq 1$), and the fourth compound semiconductor is preferably $Al_{x4}In_{y4}Ga_{(1-x4-y4)}N$ ($0 \leq x4 \leq 1$, $0 \leq y4 \leq 1$). The fourth compound semiconductor preferably has a band gap energy higher than that of the third compound semiconductor. Thus, crystal growth of the quantum well layer and the barrier layer is easily performed.

At least one of the barrier layers preferably has a thickness of 1.8 nm or more. This prevents nonradiative transition of carriers to a different level by elastic scattering.

More preferably, the barrier layer having a thickness of 1.8 nm or more is disposed between a quantum well layer constituting an upper lasing level and a quantum well layer constituting a lower lasing level. This decreases the overlap between the wave function of the upper lasing level and the wave function of the lower lasing level.

More preferably, all the barrier layers included in the active layer 12 have a thickness of 1.8 nm or more. This further prevents nonradiative transition of carriers to a different level by elastic scattering.

All the barrier layers included in the active layer 12 preferably have a thickness of 6.5 nm or less. This prevents an excessive increase in the thickness of the active layer units.

Each of the active layer units preferably includes three or more of the quantum well layers and three or more of the barrier layers. This suppresses a decrease in the resistance at a lasing threshold value or lower.

More preferably, each of the active layer units includes three of the quantum well layers and three of the barrier layers. This provides a large region where optical gain is generated in each of the active layer units.

The main surface of each of the quantum well layers and the main surface of each of the barrier layers have an orientation different from a (0001) orientation. This decreases the internal electric field.

More preferably, the main surface of each of the quantum well layers and the main surface of each of the barrier layers have an off-angle of ±1° with respect to a (1−100) orientation. This decreases the internal electric field to a negligible degree.

A supporting substrate 21 bonded to the first electrode 15 or the second electrode 14 or a supporting substrate 21 electrically connected to the first electrode 15 or the second electrode 14 is preferably further included. This allows lasing at a low threshold value.

A metal layer 31 is preferably disposed between the first electrode 15 and the second electrode 14. This increases the confinement factor of electromagnetic waves. More preferably, the metal layer 31 is disposed in at least one of the first contact layer 32 and the second contact layer 13.

At least one of the first contact layer 32 and the second contact layer 13 is preferably formed by selective growth using the metal layer 31 as a mask. This makes it easy to form the first contact layer 32 or the second contact layer 13 and the metal layer 31.

The embodiments disclosed herein are illustrative in all respects and should not be understood as being limitative. The scope of the present invention is defined not by the above description but by the claims and is intended to embrace all the modifications within the meaning and range of equivalency of the claims.

REFERENCE SIGNS LIST 10,20,30,40 QCL
11 substrate
12 active layer
13 second contact layer
14 upper electrode
15 lower electrode
21 supporting substrate
31 metal layer
32 first contact layer

The invention claimed is:

1. A quantum cascade laser comprising:
a first electrode;
a first contact layer that is in contact with the first electrode and is made of a first compound semiconductor;
a second electrode having a polarity opposite to that of the first electrode;
a second contact layer that is in contact with the second electrode and is made of a second compound semiconductor; and
an active layer disposed between the first contact layer and the second contact layer and including two or more active layer units, wherein
each of the active layer units includes one or more quantum well layers made of a third compound semiconductor and one or more barrier layers made of a fourth compound semiconductor, and each of the quantum well layers and each of the barrier layers are alternately stacked,
the third compound semiconductor is $Al_{x3}In_{y3}Ga_{(1-x3-y3)}N$ ($0 \leq x3 \leq 1$, $0 \leq y3 \leq 1$),
the fourth compound semiconductor is $Al_{x4}In_{y4}Ga_{(1-x4-y4)}N$ ($0 \leq x4 \leq 1$, $0 \leq y4 \leq 1$),
the fourth compound semiconductor has a band gap energy higher than that of the third compound semiconductor,
at least one of the barrier layers has a thickness of 1.8 nm or more, and
a main surface of each of the quantum well layers and a main surface of each of the barrier layers have an off-angle of $\pm 1°$ with respect to a (1−100) orientation.

2. The quantum cascade laser according to claim 1, wherein the barrier layer having a thickness of 1.8 nm or more is disposed between a quantum well layer constituting an upper lasing level and a quantum well layer constituting a lower lasing level.

3. The quantum cascade laser according to claim 1, wherein each of the active layer units includes three or more of the quantum well layers and three or more of the barrier layers.

4. The quantum cascade laser according to claim 1, further comprising a supporting substrate bonded to the first electrode or the second electrode or a supporting substrate electrically connected to the first electrode or the second electrode.

5. The quantum cascade laser according to claim 1, wherein a metal layer is disposed between the first electrode and the second electrode.

6. The quantum cascade laser according to claim 5, wherein the metal layer is disposed in at least one of the first contact layer and the second contact layer.

7. The quantum cascade laser according to claim 6, wherein the at least one of the first contact layer and the second contact layer is formed by selective growth using the metal layer as a mask.

8. A quantum cascade laser comprising:
a first electrode;
a first contact layer that is in contact with the first electrode and is made of a first compound semiconductor;
a second electrode having a polarity opposite to that of the first electrode;
a second contact layer that is in contact with the second electrode and is made of a second compound semiconductor; and
an active layer disposed between the first contact layer and the second contact layer and including two or more active layer units, wherein
each of the active layer units includes one or more quantum well layers made of a third compound semiconductor and one or more barrier layers made of a fourth compound semiconductor, and each of the quantum well layers and each of the barrier layers are alternately stacked,
the third compound semiconductor is $Al_{x3}In_{y3}Ga_{(1-x3-y3)}N$ ($0 \leq x3 \leq 1$, $0 < y3 \leq 1$),
the fourth compound semiconductor is $Al_{x4}In_{y4}Ga_{(1-x4-y4)}N$ ($0 \leq x4 \leq 1$, $0 < y4 \leq 1$),
the fourth compound semiconductor has a band gap energy higher than that of the third compound semiconductor,
at least one of the barrier layers has a thickness of 1.8 nm or more,
a main surface of each of the quantum well layers and a main surface of each of the barrier layers have an orientation different from a (0001) orientation and have an off-angle of $\pm 1°$ with respect to a (1−100) orientation.

* * * * *